United States Patent

[11] 3,590,346

[72] Inventors William J. Bilo
Irwin, Pa.;
Nicholas Ernick, Jr., Greensburg, Pa.; John W. Motto, Jr., Greensburg, Pa.; Thorndike C. T. New, Scottsdale, Ariz.

[21] Appl. No. 875,354
[22] Filed Nov. 10, 1969
[45] Patented June 29, 1971

[73] Assignee Westinghouse Electric Corporation
Pittsburgh, Pa.

[54] HIGH D/D, FAST TURN-ON DARLINGTON CONTROLLED SEMICONDUCTOR SWITCH
14 Claims, 10 Drawing Figs.

[52] U.S. Cl. .......... 317/235 R, 317/234 R, 307/305, 307/315, 317/235 AA, 317/235 AB, 317/234 N
[51] Int. Cl. .......... H01l 11/00, H01l 15/00
[50] Field of Search .......... 317/234, 235, 30, 40, 41, 41.1; 307/305, 315

[56] References Cited

UNITED STATES PATENTS

| | | | |
|---|---|---|---|
| 3,244,950 | 4/1966 | Ferguson | 307/315 X |
| 3,331,000 | 7/1967 | Moyson et al. | 317/235 |
| 3,427,512 | 2/1969 | Mapother | 317/235 |
| 3,527,963 | 9/1970 | Suzuki et al. | 307/305 X |

FOREIGN PATENTS

| | | | |
|---|---|---|---|
| 1,418,640 | 10/1965 | France | 317/235 |

*Primary Examiner*—John W. Huckert
*Assistant Examiner*—Andrew J. James
*Attorneys*—F. Shapoe and C. L. Menzemer ABSTRACT: A high *di/dt*, fast turn-on Darlington controlled rectifier semithyristor semiconductor switch embodies a body of semiconductor material wherein two controlled rectifier switches are formed, each having a separate gate and a separate cathode but both sharing a common anode. The cathode current of one controlled rectifier switch is the gate current for the second controlled rectifier switch thereby enabling a small initial current to be amplified and turn-on a larger controlled rectifier switch whereby the overall effect is a fast turn-on gate controlled switch with a high *di/dt* rating.

HIGH D/D, FAST TURN-ON DARLINGTON CONTROLLED SEMICONDUCTOR SWITCH

BACKGROUND OF THE INVENTION

1. Field of the Invention

This invention relates to semiconductor devices and in particular to a semiconductor Darlington controlled rectifier thyristor switch.

2. Description of the Prior Art

Heretofore the full capabilities of semiconductor controlled rectifier switches have been limited by their inherent inability to withstand high *di/dt* during turn-on switching. A controlled rectifier switch will burn out when the increase of *di/dt* (the rate of rise of the current with respect to change in time) exceeds a critical value as determined by the material comprising the switch. The burnout of power controlled rectifier switches occurs frequently although many different gating geometries have been employed.

The conventional side-fire gate is severely limited because turn-on is initiated at one spot which is then required to conduct extremely high current densities and extremely high power density occurs. A center-fire gate has been successfully employed to improve the *di/dt* capability of the gate controlled switch, however, overdrive of the gate is required to assure turn-on does not occur at the most sensitive spot of the cathode periphery which results in *di/dt* failure of the switch. Also the center-fire switch does have a turn-on time to full area conduction of nearly half that of a side-fire device because of its geometrical symmetry. Thus, the center gate device definitely does exhibit reduced turn-on losses with the condition of high magnitude fast rising gate drive.

The ring gate geometry would seem to be the ideal arrangement for a power gate controlled switch since the gate area must be increased. However, the ring gate turns "on" one spot as does the side-fire gate. Because of the larger gate area, the ring gate device has a lower gate sensitivity than does the side-fire or center-fire device. Thus the ring gate power switch suffers from even more limitations than does the side or center-fired gate controlled switch.

Multiple gates have also been used in an attempt to improve gate controlled switch usage at high *di/dt* ratings. It would appear that multiple gates should increase the *di/dt* limit, but one of these gates statistically will always initiate first if again a fast rising overdrive gate signal is not utilized and thereby cause local burn out to occur.

The "skip gate" device with the long offset emitter to gate geometry can indirectly protect against *di/dt* burnout by limiting the circuit current during turn-on However, the "skip gate" device has reduced cathode contact area and has extremely long turn-on delay times which limit the use of the skip gate device.

An object of this invention is to provide a semiconductor gate controlled switch which will "turn on" fast, "turnoff" fast, have a higher *di/dt* rating, and be less susceptible to internally produced temperature gradients than prior art controlled rectifier thyristors.

Another object of this invention is to provide a semiconductor controlled rectifier switch whereby a low voltage, low current signal is amplified to initiate a fast "turn on" of the switch.

Another object of this invention is to provide a semiconductor device embodying a first small gate rectifier switch integral with and surrounded by a second and larger controlled rectifier switch wherein both switches mutually share a common anode region and the cathode current of the small controlled rectifier switch is employed as a gate current to "turn on" the large controlled rectifier switch.

Another object of this invention is to provide a semiconductor device wherein the cathode current flowing through a readily adjustable resistor of a predetermined value is employed as a gate current to "turn on" a second controlled rectifier switch, the two switches being embodied in the same body of semiconductor material.

Other objects of this invention will, in part, be obvious and will, in part, appear hereinafter.

SUMMARY OF THE INVENTION

In accordance with the teachings of this invention there is provided a semiconductor device comprising a wafer of semiconductor material. The wafer has a top surface, a bottom surface and four regions of alternate type semiconductivity. The first and the third regions are of a first type semiconductivity and the second and fourth regions are of a second type semiconductivity. A PN junction is formed by each pair of contiguous surfaces of regions of different type semiconductivity. The fourth region has a surface which comprises at least in part the bottom surface of the wafer. The device is either of a planar configuration or of a mesa configuration.

The first and second regions each have surfaces comprising the top surface of the wafer. The second region comprises at least two portions. A first portion is axially disposed and has a surface comprising the center portion of the top surface. A second portion of the second region is radially spaced from the first portion of the second region, by a first portion of the first region; each of the second portion and the first portion of the second region having surfaces comprising the top surface of the body. A second portion of the first region has a surface comprising the top surface of the body and is radially spaced apart from the first portion of the first region by the second portion of the second region.

An electrical contact affixed to the surface of the first portion of the second region enables one to make an external electrical connection to the second region. Electrical contacts affixed to the surfaces of the first portion of the first region and to the second portion of the second region enables one to electrically connect these two portions together electrically. An electrical contact affixed to the surface of the second portion of the first region enables one to provide an external electrical connection to the second region. An external electrical connection to the fourth region is obtained by use of an electrical contact affixed to the surface of the fourth region.

DRAWINGS

In order to better understand the invention reference should be made to the following drawings, in which.

DESCRIPTION OF THE INVENTION

Figure 1:
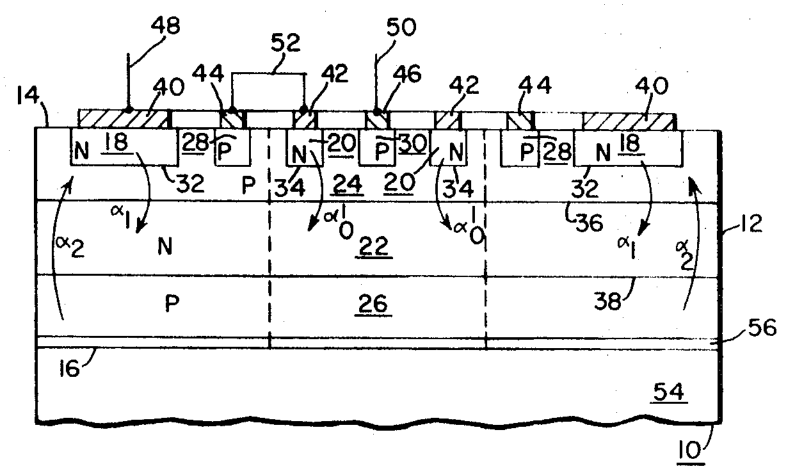
FIG. 1 is an elevational view, in cross section, of a semiconductor device made in accordance with the teachings of this invention.

Referring now to FIG. 1 there is shown a semiconductor element 10 comprising a body 12 of semiconductor material having a top surface 14 and a bottom surface 16. The semiconductor material comprising the body 12 may be silicon, germanium, silicon carbide, a compound of a Group II element and a Group VI element and a compound of a Group III element and a Group V element. In order to describe the invention more specifically the body 12 will be described as being of silicon semiconductor material.

The body 12 of the element 10 has regions 18, 20, and 22 of first type semiconductivity and regions 24, 26, 28 and 30 of a second and opposite type semiconductivity. PN junctions 32, 34, 36 and 38 are formed by the contiguous surfaces of regions 18 and 24, 20 and 24, 22 and 24, and 22 and 26 respectively of opposite type semiconductivity. The element 10 may have a PNPN configuration of an NPNP configuration and be of an all diffused structure or a combination diffused and alloyed structure. As shown in FIG. 1 the element 10 is of an NPNP configuration wherein regions 22, 24 and 26 may be formed by any suitable double diffusion of P-type impurity material into a suitably prepared N-type substrate. Regions 18, 20, 28, and 30 are formed by recrystallization of the respective portions of region 24 when electrically conductive metal contacts 40, 42, 44, and 46 are affixed to the top surface of the respective regions by any suitable well-known alloying process known to those skilled in the art. An electrical lead 48 is affixed to the contact 40 and an electrical lead 50 is affixed to the contact 30. An interconnecting electrical lead 52 affixed to contacts 42 and 44 electrically joining regions 20 and 28 together and effectively shorting out the PN junction 34. An electrically conductive support member 54 comprising a material selected from the group consisting of molybdenum, tungsten, tantalum and combinations and base alloys thereof is suitably alloyed to the bottom surface 16 of the body 12 by employment of a suitable material which produces a recrystallized P-type semiconductivity region 56 thereby providing an ohmic electrical contact between the member 54 and the region 26 of the element 10.

The process of making the element 10, including the steps, for example, of beveling the wafer and coating of the circumferential edge of the element 10 which are not shown, is not described in detail for such processing and treatment of the element 10 is well known in the art and not pertinent to the invention herein.

The structure of the element 10 which is a controlled rectifier switch is a cascaded structure, to aid in switching of the element 10 during operation of the element 10. When the material of the body 12 is silicon, the element 10 is a Silicon Controlled Rectifier, SCR, switch. The element 10 is designed to produce an $\alpha$, which is greater than 0.5 and an $\alpha'_o$ which is also greater than 0.5 which enables the overall gate current of the element 10 to be very small. $\alpha_2$ also rejects carriers into region 24, as well as $\alpha_1$ and $\alpha'_o$, under the gate region 30. However, the gate region 30 may be grounded by employing regions 20 and 28 connected together electrically by electrical lead 52 and thereby prevent premature switching of the element 10 because of high temperatures occurring when the element 10 is operating and inherently produces thermal energy. If the thermal energy is not dissipated quickly enough, the element 10 may reach a temperature high enough which causes the element 10 to switch prematurely. However, with the gate region 30 grounded as shown in FIG. 1, the element 10 is able to withstand much higher operating temperatures. Therefore, the region 24 has a high surface concentration in order to produce an $\alpha_1$ which is low due to the low voltage which can be supported by the region 24 but $\alpha_1$ must not be less than 0.5 and preferably is from 0.7 to 0.8 resulting in a value for $\beta$ equal to from 2.3 to 4 thereby enabling the cascading structure of element 10 to have a value for $\beta$ equal to from 6 to 16 or an equivalent $\alpha_1$ of from 0.85 to 0.94. With a 200 milliampere gate current flowing through lead 50 to the contact 46 and thence to the gate region 30, this current is sufficient to bring the current of the gate of the main controlled rectifier (PNPN regions 26, 22, 24, and 18 with gate region 28), to form 1.2 to 3.2 amperes dependent on resistivity. This electrical current is now sufficient to cause the $\alpha_2$ to increase much higher than that which was required for switching prior to cascading which was 1−[0.7 to 0.8].

Figure 2:
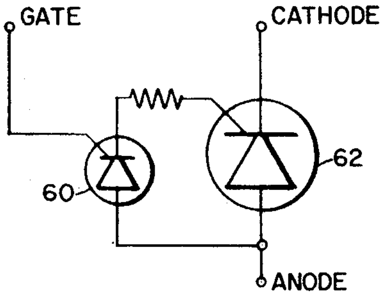
FIGS. 2 and 3 are each a different form of an electrical schematic diagram of the semiconductor device of FIG. 1.

The element 10 has an equivalent circuit as shown in FIG. 2. In essence the element 10 is two controlled rectifier switches integral with each other within the one body 12 of semiconductor material of the element 10. A first controlled rectifier switch 60 is employed to turn on a second controlled rectifier switch 62 enabling a small current which turns on the switch 60 to be magnified thereby turning on the switch 62 with a greater gate current. The end result is that the switch, as exemplified by the element 10 of FIG. 1, employs a low magnitude, slow rise time gate current or signal, turns on faster, has a higher *di*/*dt* rating than prior art control rectifier switches as well as having the capability of turning off faster.

When a signal is sent to the gate lead 50 in the form of a pulse of current, the initial switch which turns on is one whose configuration is found in the central portion of element 10 and consists of region 26 and its recrystallized portion 56, region 22, 24 and its recrystallized portion 30 and region 20 as well as the respective contacts and PN junctions existing therebetween the regions. Electrical lead 50 and contact 46 are therefore only one of the two gate leads and contacts present in the element 10 and therefore the current flowing in through the first gate to a first gate region consisting of regions 24 and 30 beneath contact 46 is labeled $I_{G_1}$ in the block diagram of the equivalent circuit in FIG. 3.

Figure 3:
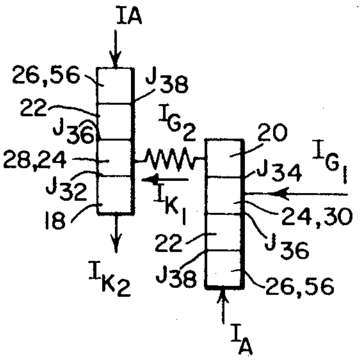

Also present in the element 10 is the second, and larger, switch 62 which surrounds the smaller switch 60. The switch 62 consists of region 26 and its associated recrystallized region 56, region 22, region 24 and its recrystallized portion 28 and region 18 as well as the respective electrical contacts and the PN junctions located between the respective regions. Referring to FIGS. 1, 2 and 3 the gate region of the switch 62 is the second gate region in the element 10 and consists of region 24 and its recrystallized portion 28 beneath contact 44. The gate lead is electrical lead 52 and the electrical contact to this second gate region is contact 44. The cathode current $I_{K_1}$ of switch 60 is employed as the gate current $I_{G_2}$ of switch 62. Since contacts 42 and 44 and lead 52 are made of metal, and since region 24 between regions 28 and 18 has an effective resistance some electrical resistance is present in the second gate electrical circuit and is shown as such in FIGS. 2 and 3. The cathode current of the switch 62 is labeled $I_{K_2}$ and the anode current is the same as for the switch 60 since it is common to both. When looking at the element 10 when it is encapsulated the gate lead 50 is actually the first gate lead and the cathode lead 48 is actually the second cathode lead.

The element 10 is less susceptible to burning out when the element 10 is turned on since only a small initial gate current is required to turn on the switch 60 thereby minimizing "hot spots" in the body 12. The greatly amplified current $I_{K_1}$ is then employed as the second gate current $I_{G_2}$. The second gate region is a very large region in comparison to the first gate region which it surrounds and the magnitude of the gate current $I_{G_2}$ is sufficient to turn on the second switch 62 substantially instantaneously, minimizing turn-on dissipation thereby enabling the overall element 10 to have a higher *di*/*dt* rating than prior art devices. Although internal heating of the element still occurs, the probability of the element 10 burning out when being "turned on" is greatly minimized.

Figure 4:
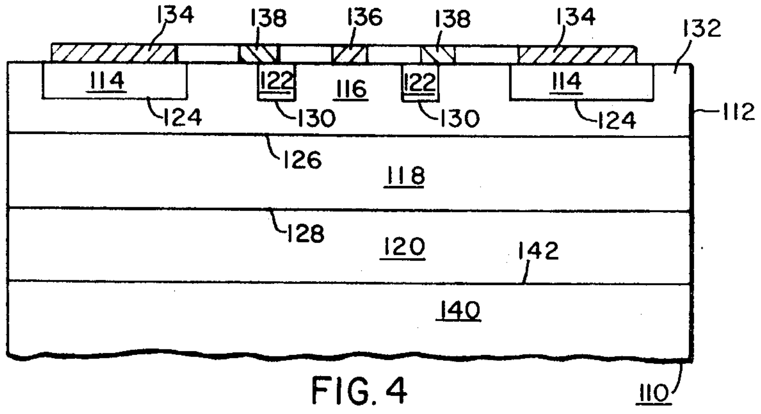
FIG. 4 is an elevational view, in cross section, of an alternate embodiment of the semiconductor device of FIG. 1 made in accordance with the teachings of this invention.

Referring now to FIG. 4, there is shown an element 110 which is the same as the element 10 except it is made by an all diffusion process or by a combination epitaxial growth process followed by diffusion. The element 110 comprises a body 112 of semiconductor material, the same as the body 12 of element 10, and having a first emitter a cathode region 114, a first base or gate region 116, a second base region 118, a second emitter region 120 and a third emitter region 122. PN junctions 124, 126, 128 and 130 are formed between each respective pair of regions of opposite type semiconductivity 114 and 116, 116 and 118, 118 and 120, and 122 and 116 respectively. The element 110 may have a PNPN configuration or an NPNP configuration. The first and third emitter regions 114 and 122 respectively are of the same type semiconductivity. As shown the element 110 is a planar device wherein the top surfaces of each of the first and third emitter regions 114 and 122, as well as that of the gate region 116 comprise top surface 132 of the element 110. Not shown or described in detail is the treatment, for example, of beveling the wafer and coating of the circumferential edge of the element 110, for such treatment is well known in the art and not pertinent to the invention herein.

A first ohmic electrical contact 134, or cathode contact, consisting of a layer of an electrically conductive metal, such for example, as aluminum, gold, titanium, silver, and the like, is joined to a portion of the region 114. A second electrical contact, or gate contact 136 consisting of an electrically conductive metal such, for example, as aluminum, gold, silver, titanium and the like, is joined to a portion of the region 16. A third electrical contact 138 consisting of an electrically conductive metal such for example, as aluminum, gold, silver, and the like, is joined simultaneously to a portion of both regions 122 and 116 covering the exposed portion of the PN junction 130 terminating in the surface 132 therebetween.

It is preferred that the gate contact 136 be centrally disposed within the area defined by the third contact 138 which in turn is disposed within the area defined by the cathode contact 134. The third electrical contact 138 preferably is disposed on the exposed portion of the PN junction 130 furthest from the gate contact 136. The third contact 138 performs the same function as contacts 42 and 44 perform along with interconnecting lead 52.

A support electrode member 140, the same as member 54 of element 10 is joined to bottom surface 142 of the body 112 by a layer of ohmic solder material, not shown.

Since all contacts to the element 110 are ohmic electrical contacts there are no recrystallized regions of semiconductor material in the element 110. Therefore, the initial switch which turns on the layer switch comprises regions 120, 118, 116 and 122 with contact 136 acting both as the main gate to the element 110 as well as the first gate contact, that being the gate contact to region 116. Cathode current $I_{K_1}$ of this initial switch is the gate current $I_{G_2}$ for the second and larger switch comprising regions 120, 118, 116 and 114, with contact 138 functioning both as the cathode contact for the first switch and the second gate switch of the element 110, that being the gate switch for the second switch.

However, in both elements 10 and 110, the internal heating of the elements is still a problem and with increasing sustaining operating currents and higher voltage requirements, the danger of burnout during the time the switch is being turned on is still a cause of concern. It has been found that if an external resistance is added external to the semiconductor element, the internal heating of the element is reduced, the *di/dt* rating is improved greatly and the element turns on faster as well as turns off faster while the characteristics of the element are greatly stabilized, the element being more reliable and substantially free of susceptibility to burn out during the turning on of the element.

Figure 5:
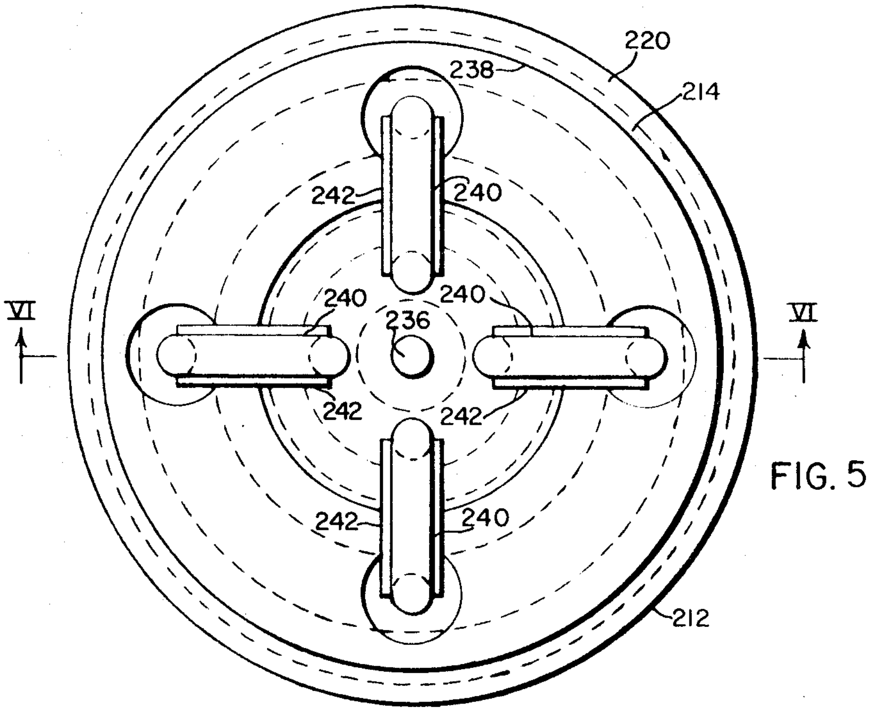
FIG. 5 is a planar view of a semiconductor device made in accordance with the teachings of this invention.
Figure 6:
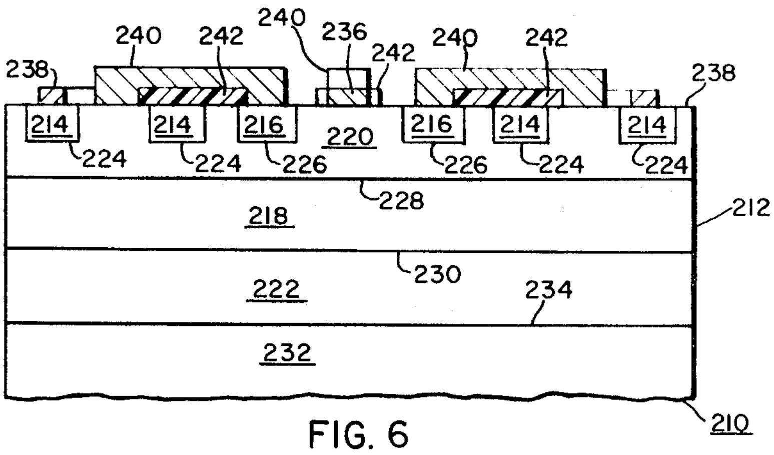
FIG. 6 is an elevational view, in cross section of the semiconductor device shown in FIG. 5 taken along cutting plane VI–VI.

With reference to FIGS. 5 and 6 there is shown an element 210 which is a modification of the elements 10 and 110 made in accordance with the teachings of this invention. The element 210 is made in the same manner as the element 110 except for the use of a multiplicity of secondary gates.

The element 210 comprises a body 212 of semiconductor material selected from the same group of semiconductor materials as the bodies 12 and 112. The body 212 is suitably processed to form regions 214, 216 and 218 of first type semiconductivity, regions 220 and 222 of second type semiconductivity and PN junctions 224, 226, 228 and 230 are formed by the contiguous surfaces of the respective regions of 214 and 220, 216 and 220, 218 and 220, and 218 and 222 of opposite type semiconductivity material. An electrically conductive support member 232 is affixed to bottom surface 234 of the body 212 by a layer of solder (not shown) and is in ohmic electrical contact therewith. The material of the member 232 is one of the materials suitable for members 54 and 140 of respective elements 10 and 110.

An ohmic electrical contact 236 is affixed to top surface 238 of the body 212 as functions as the first gate contact of the element 210. The region 216 is disposed about the portion of the region 220 beneath the contact 236 and may or may not, be continuous thereby forming either a washer like structure of a structure of arcuate areas spaced from the contact 236. Disposed further from the center of the element 210 and spaced apart from region 216 is the region 214 having two or more portions of the region 220 disposed therein. As shown in FIG. 5, four exposed portions of the region 220 are shown equally spaced within the region 214 and each serves as one of a plurality of secondary gate regions for the element 210. The region 214 may be continuous as shown or consist of arcuate areas. An ohmic electrical contact 238 is affixed to the region 214. A plurality of ohmic electrical contacts 240 electrically connects a portion of the region 216 which is the cathode region of a first switch comprising regions 222, 218, 220 and 216 with one of the plurality of portions of the region 220 which function as a part of the gate region of the second switch of the element 210 which comprises regions 222, 218, 220 and 214. A layer 242 of an electrically insulating material such for example as silicon oxide, silicon nitride and silicon oxide-silicon nitride composite is disposed on the surface 238 to permit bridging of the contacts 240 as required without short circuiting of the contacts 240 as required without short circuiting of the contacts 240 with regions of the element 210 which it must traverse.

The size, shape, material and the resistivity of the material employed for making the contacts 240 may be varied as one desires. This enables one to employ the contacts 240 as resistive elements for employing the cathode current of the first switch of element 210 to create thermal energy external to the body 212 where it can be dissipated more readily and also has no appreciable effect on the characteristics of the element 210 and the material comprising the body 212. Proper design of the contacts 240 also enables one to tailor the gate current to the secondary gates and prevents too large a current from entering the gate region of the second switch of the element 210 and thereby prevents the premature failure of the element 210 because of burn out during "turning on" of the second switch. The physical configuration, whether it be planar as shown in FIG. 6, or of mesa construction, provides a more uniform "-turn on" of the cathode region of the second switch and therefore the entire element 210 than that which is obtainable with elements 10 and 210. The more uniform " turn on" of the element 210 therefore generates less internal thermal energy which must be dissipated by the element 210 and could adversely affect the functions of the element 210.

Figure 7:
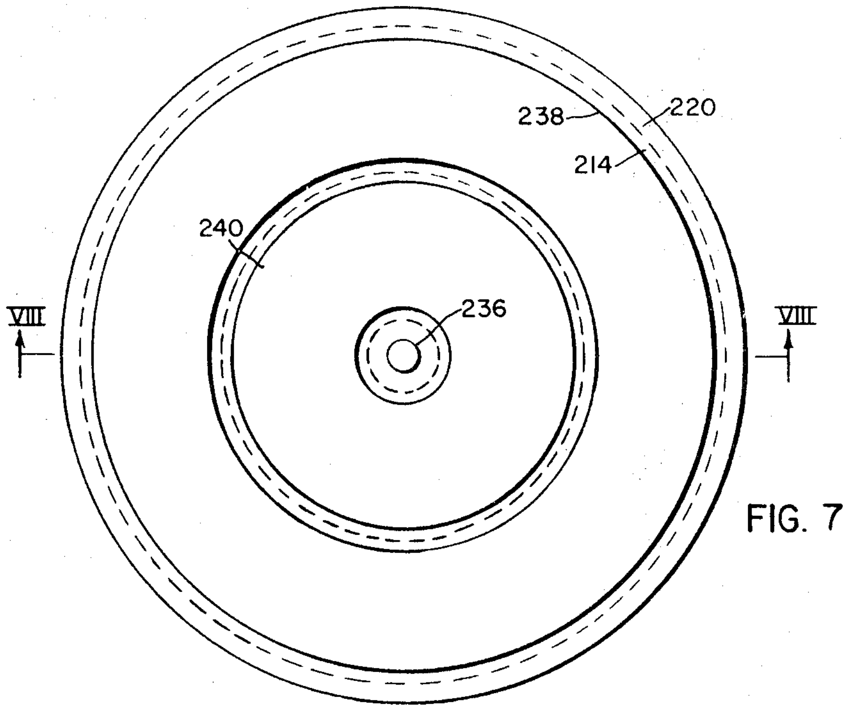
FIG. 7 is a planar view of another semiconductor device made in accordance with the teachings of this invention.
Figure 8:
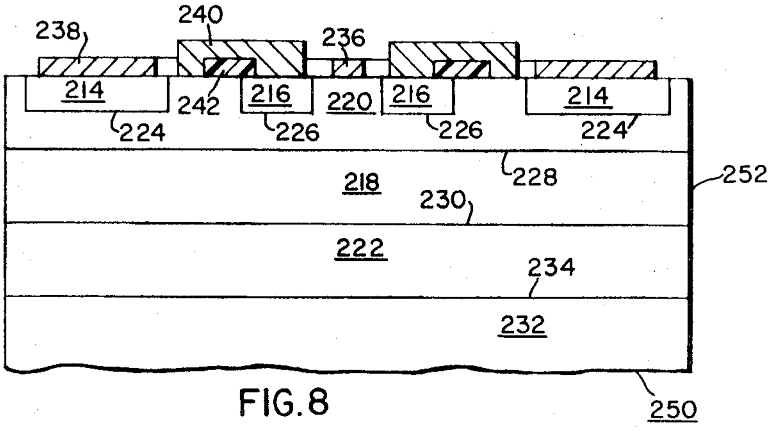
FIG. 8 is an elevational view, in cross section, of the semiconductor device shown in FIG. 7 taken along cutting plane VIII–VIII.

Referring now to FIGS. 7 and 8 there is shown element 250 which is an alternate embodiment of this invention and a modification of the element 210. Element 250 comprises a body 252 of semiconductor material of one of the materials comprising and processed in the same manner as that for the body 212 of element 212. The only difference is that element 250 has only two gate regions and two cathode regions whereas element 210 had three or more gate regions and two cathode regions wherein two or more gate regions were disposed within the larger of the two cathode regions.

Preferably the element 250 is of planar construction for ease of manufacture and cathode regions 214 and 216 are shown having continuous areas. However, the regions 214 and 216 may be arcuate areas and the element 250 may also be constructed in a mesa configuration.

Figure 9:
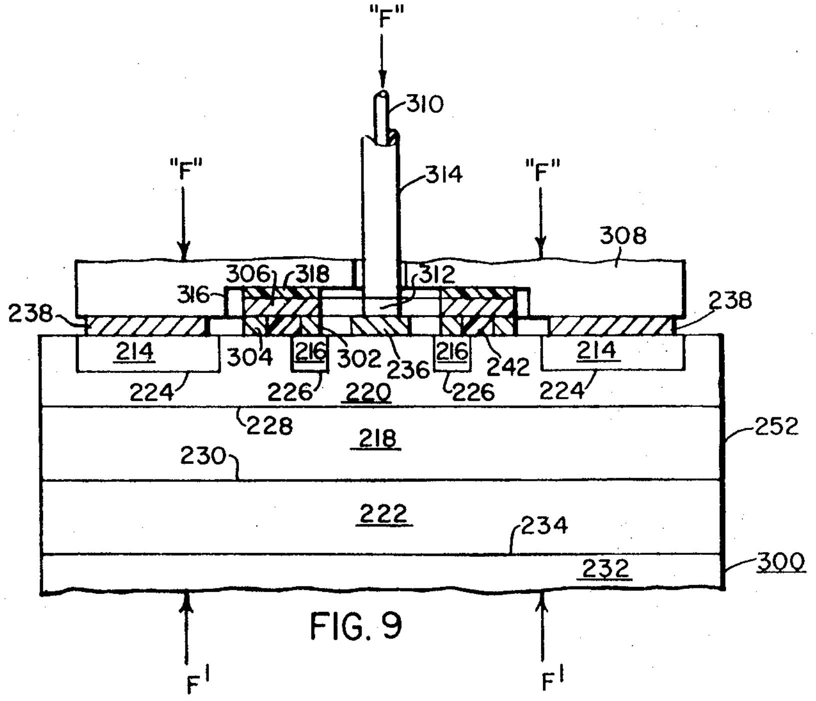
FIG. 9 is an elevational view, partly in cross section, of a portion of an electrical device made in accordance with the teachings of this invention.

It is desirable that the resistance of the contact 240 be readily adjustable to meet design requirements. Therefore, as shown in FIG. 9, the contact 240 of element 250 has been modified to include an ohmic electrical contact 302 affixed to region 216, a first cathode region, an ohmic electrical contact 304 affixed to the second gate region of element 300 and an electrical bridging contact member 306 electrically connecting contacts 302 and 304 together.

The bridging contact member 306 may be made of nichrome or similar metals or even be fabricated from an electrically conductive ceramic material having a predetermined resistivity and is employed as an external limit resistor. This arrangement along with the design of the pressure electrical contact assembly embodying member 306 improves the removal of heat from the element 250 and the efficiency of the element 250 is increased remarkably. With the improvement making thermal dissipation occurring remote from the body 252, the difficulty still occurring in prior art switches of thermal dissipation difficulties occurring even with low gate drives is thereby resolved. It is important that contact 304 be attached as close as physically possible to junction 224 of region 214. This is required to achieve the maximum and the most uniform possible turn-on of region 214 which is the cathode of the main controlled rectifier switch 62. Contact member 306 functions in the same manner as contact 240, however the material of contact member 306 may be a metal or an electrically conductive ceramic which can be easily changed to obtain the desired resistance value for the contact member 306. The member 306 may be continuous or consist of two or more arcuate members. The layer 242 of electrically insulating material may be omitted if one desires, however, its presence is preferred to assure the electrical integrity of the element 300.

The element 300 is suitable for use in compression bonded encapsulated electrical devices. A large area electrical contact 308 comprising an electrically conductive material such, for example, as copper is disposed upon the contact 238 and held in a pressure electrical contact therewith by suitable resilient force means indicated by the force lines "F". A gate lead 310 extends downwardly through an aperture in the contact 308 and terminates in a button shaped contact member 312 held in a pressure electrical contact relationship with contact 310 by a force "F" suitably applied, such, for example, as by resilient force means acting on the lead 310. The lead 310 is encased in a jacket 314 of an electrically insulating material to prevent electrical shortcircuiting from occurring between lead 310 and contact 308.

The member 306 is disposed about the lead 310 in a recess of the contact 308. The member 306 is electrically insulated from the contact 308 by a layer 318 of an electrically insulating material such, for example, as polytetrafluoroethylene, trifluoromonochloroethylene, melamine impregnated cloths and fiber glass, and phenolic resin impregnated cloths and fiber glass. Preferably, the bridging member 306 should be easily located and oriented within the recess 316 without substantial movement or misalignment of the bridging member 306 occurring in the device.

Figure 10:
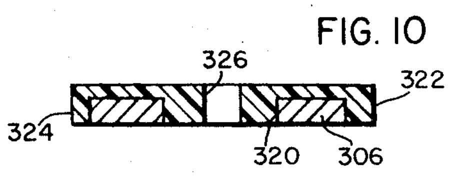
FIG. 10 is an elevational view, in cross section of an electrical contact and an electrically insulating member suitable for use in the electrical device shown in FIG. 9.

FIG. 10 illustrates one means of aligning the bridging member 306 in the recess 316. The bridging member 306 in one or more pieces is inlaid within a recess 320 of a body 322 of one of the insulating materials described as comprising the member 318. Preferably the body 322 has an outer peripheral portion 324 to prevent electrical short circuiting between member 306 and 308 from occurring. Alignment is achieved by having the gate lead 310 extend downwardly through aperture 326 which extends entirely through the body 322.

Preferred materials for the body 322 is polytetrafluoroethylene and trifluoromonochloroethylene. These materials have physical properties which allow it to cold flow under pressure. The cold flow proceeds only to a given limit and then essentially ceases, whereupon the body 322 acts as a rigid member. Upon assuming the property of a rigid member, the material of the body 322 continually transmits any force applied to the body 322 without further appreciable cold flowing occurring. Employment of these members enables one to substantially eliminate any problems which manufacturing tolerances of the components may give which could cause poor electrical contacting or no contacting at all from occurring between electrically conductive members resulting in an inoperative electrical device.

The element 300 is supported by a thermally and an electrically conductive support member within a hermetically sealed encapsulation which includes the contact 308, the associated components of same and the resilient force means acting on both the contact 308 and the gate lead 310. The application of the force "F" causes the support member to produce a reactive force "F" which in combination with the force "F" produces the pressure electrical contact relationship between contact 308, gate lead 30, bridging member 306 and the support member with the respective portions of the element 300.

Other embodiments of this invention comprise a suitably processed body of semiconductor material wherein the controlled rectifier switch 62 comprises an interdigitated configuration of a plurality of second cathode and second gate regions.

To illustrate the teachings of this invention a semiconductor element embodying the two integral switches of this invention was made in the following manner:

A wafer of N-type silicon semiconductor material having two opposed major surfaces was suitably prepared by lapping and polishing and then simultaneously diffused through both surfaces with aluminum and gallium to produce a wafer having a region of N-type semiconductivity disposed between two spaced regions of P-type semiconductivity and forming PN junctions at the contiguous surfaces of the P and N-type regions. The wafer was then diffused with phosphorous as an impurity material thereby encapsulating the wafer in an N-type region of semiconductivity. Photolithographical techniques and selective etching was employed to remove all of the N-type region from the sides and one of the two opposed surfaces of the wafer as well as selected portions of the other of the two opposed surfaces of the wafer to produce a mesa type structure wherein N-type regions projected above the exposed surfaces of P-type region wherein both comprised the one surface of the wafer. One portion of N-type semiconductivity surrounded a centrally disposed portion of P-type region. Spaced radially apart from this N-type region and further from the center of the wafer was a larger N-type region in which four equally spaced P-type regions were disposed and had their surfaces exposed therein. Ohmic electrical contacts were applied to the exposed surfaces of the regions and none were overlapping any PN junctions. A molybdenum electrode was attached with an ohmic solder layer to the other surface of the wafer. An electrical lead was then affixed to the contact affixed to the centrally exposed portion of the P-type semiconductivity region. Individual electrical leads were then joined to the contact of the smaller of the two N-type regions and to each contact of the P-type regions exposed within the larger N-type region. An electrical lead was then attached to the contact affixed to the larger cathode region.

An electrical test was conducted comparing the electrical characteristics of the wafer processed in accordance with the teachings of this invention and with a controlled switch of prior art configuration. The prior art controlled rectifier switch had a centrally disposed P-type region exposed in the top surface of a N-type silicon wafer processed in the same manner as above except that only one large area N-type region circled the P-type region.

The prior art gate controlled switch "turned on" in 7$\mu$ second and "turned off" in approximately 150$\mu$ second. The wafer processed in accordance with the teachings of this invention "turned on" in 3$\mu$ second and "turned off" in 50$\mu$ second, the applied electrical potential and current being the same in each instance. Compared to the prior art device, this processed wafer exhibited considerably faster "turn on" and "turnoff" times as well as a higher *di*/*dt* rating.

We claim as our invention:

1. A semiconductor device comprising a wafer of semiconductor material, said wafer having a top surface, a bottom surface and four regions of alternate type semiconductivity, the first and third regions having a first type semiconductivity and the second and fourth regions having a second type semiconductivity;

a P-N junction formed by each pair of contiguous surfaces of regions of different type semiconductivity;

said fourth region having a surface comprising at least in part the bottom surface of said wafer;

said first and said second regions each having surfaces comprising in part the top surface of said wafer;

said first region comprising at least two portions radially spaced apart from each other, and from the center of the wafer and having portions of the surface of the second region comprising the top surface of the wafer exposed therebetween, a first portion of the first region encircling at least in part a first portion of the surface of the second region, said first portion of the second region being centrally disposed within the wafer's top surface and the second portion of said first region is larger than said first portion of said first region and encircles at least in part a second portion of the surface of the second region;

a first electrical contact affixed to the first portion of the second region;

a second electrical contact affixed to the first portion of the first region;

a third electrical contact affixed to the second portion of the second region;

a fourth electrical contact affixed to the second portion of the first region;

a fifth electrical contact affixed to the surface of the fourth region comprising at least in part the bottom surface of the wafer; and an electrically conductive connection electrically connecting said second and third electrical contacts.

2. The electrical device of claim 1 wherein said electrically conductive connection and said second and said third electrical contacts are integral with each other and form a unitary electrical contact.

3. The electrical device of claim 1 wherein said first, said second, said third, and said fourth electrical contacts are each affixed to a recrystallized portion of said second region.

4. The semiconductor device of claim 2 wherein the surfaces of said first and said second regions comprising said top surface of said body lie in the same plane and said unitary electrical contact is affixed to an end portion of the PN junction between said first portion of said first region and said second portion of said second region exposed in the top surface thereby electrically shortcircuiting the PN junction.

5. The semiconductor device of claim 2 including a layer of an electrically insulating material disposed on at least that portion of the top surface of said body between said second and said third electrical contact portions of said unitary electrical contact including an end portion of that PN junction formed between said first portion of said first region and said second portion of said second region exposed in said at least that portion of the top surface.

6. The semiconductor device of claim 1 including a third portion of said second region having at least two distinct surface areas exposed in said top surface of said body, each of the at least two surface areas being substantially surrounded by said second portion of said second region; and said third electrical contact consists of at least two electrically conductive members, each of the members being affixed to a separate surface of the at least two surface areas of the third portion of the second region; and said electrically conductive connection comprises at least two electrical leads, each electrical lead being affixed to the first portion of the first region and only one of the at least two surface areas of the third portion of the second region.

7. The electrical device of claim 1 wherein said electrically conductive connection is in a pressure electrical contact relationship with said second and said third electrical contacts.

8. The electrical device of claim 7 wherein said electrically conductive connection comprises an electrically conductive metal having a predetermined resistivity.

9. The electrical device of claim 8 wherein said electrically conductive connection comprises an electrically conductive ceramic having a predetermined resistivity.

10. The electrical device of claim 7 including a sixth electrical contact in a pressure electrical contact relationship with said fourth electrical contact, said sixth electrical contact having a top surface, a bottom surface, an axially disposed recess formed in the bottom surface and extending radially outwardly from the center of the sixth electrical contact and having a third surface substantially parallel to and intermediate of said top and bottom surfaces, side walls extending from said third surface to said bottom surface, and an axially disposed aperture extending through said sixth contact from said top surface to said third surface of said recess; and said electrically conductive connection is disposed about the aperture of said sixth contact within said recess and electrically insulated from said sixth electrical contact by a layer of electrically insulating material whereby, said sixth electrical contact acts on said electrically insulating material and said electrically conductive connection to urge said electrically conductive connection into the pressure electrical contact relationship with said second and said third contacts.

11. The semiconductive device of claim 10 including an electrical lead extending axially downwardly through the aperture of said sixth electrical contact, through an axially disposed aperture extending entirely through said layer of electrically insulating material, through an axially disposed aperture extending entirely through said electrically conductive connection to electrically connect with said first electrical contact in a pressure electrical contact relationship.

12. The semiconductor device of claim 11 wherein said layer of electrically insulating material has an axially disposed boss which protrudes downwardly through the aperture of said electrically conductive connector, the aperture of said layer of electrically insulating material being axially disposed within the boss.

13. The semiconductor device of claim 12 wherein said layer of electrically insulating material has an outer peripheral portion which encloses the outer peripheral surface of said electrically conductive connection whereby said electrically conductive connection is disposed in a recess formed within the insulating material.

14. The electrical device of claim 13 wherein said layer of electrically insulating material comprises a material selected from the group consisting of polytetrafluoroethylene and trifluoromonochloroethylene.